United States Patent [19]

Sheats

[11] Patent Number: 4,705,729
[45] Date of Patent: Nov. 10, 1987

[54] METHOD FOR PHOTOCHEMICALLY ENHANCING RESOLUTION IN PHOTOLITHOGRAPHY PROCESSES

[75] Inventor: James R. Sheats, Palo Alto, Calif.

[73] Assignee: Hewlett-Packard Company, Palo Alto, Calif.

[21] Appl. No.: 673,243

[22] Filed: Nov. 19, 1984

[51] Int. Cl.$^4$ ............................................. G03F 9/00
[52] U.S. Cl. ........................................ 430/5; 430/269; 430/311; 430/313
[58] Field of Search ................. 430/5, 339, 292, 346, 430/270, 945, 311, 313, 269

[56] References Cited

U.S. PATENT DOCUMENTS

| | | | |
|---|---|---|---|
| 3,502,476 | 3/1970 | Itano et al. | 430/344 |
| 3,615,562 | 10/1971 | Harrison et al. | 430/339 |
| 4,448,873 | 5/1984 | Walls et al. | 430/292 |
| 4,515,877 | 5/1985 | Barzynski et al. | 430/5 |

FOREIGN PATENT DOCUMENTS

110165A2 6/1964 European Pat. Off. .

OTHER PUBLICATIONS

West, Paul R. and Griffing, Bruce F., "Contrast Enhancement—A Route to Submicron Optical Lithography", *Proceedings of SPIE*, vol. 394, 1983, pp. 33–38.
Bartlett, K.; Hillis, G.; Chen, M.; Trutna, R.; and Watts, M., "A Two Layer Photoresist Process in a Production Environment",*Proceedings of SPIE*, vol. 394, 1983, pp. 49–56.
Tai et al., "Submicron Optical Lithography Using an Inorgannic Resist/Polymer Bilevel Scheme,"*J. Vac. Sci. Technol.*, 17(5), 1980, pp. 1169–1176.

*Primary Examiner*—Won H. Louie
*Attorney, Agent, or Firm*—Edward Y. Wong; Paul L. Hickman

[57] ABSTRACT

In the fabrication of integrated circuits, a polymethyl methacrylate film containing a selected dye and exhibiting a strong dependence on light intensity is photobleached to provide an optical mask to pattern an underlying photoresist layer. While the film is photobleached, the underlying photoresist layer is made to be substantially unaffected by the photobleaching process. When the optical mask is realized, it is used to mask the light-sensitive photoresist layer when the photoresist layer is exposed to light. However, the photobleached layer, which is also sensitive to light, is now in turn made to be substantially unaffected by the exposure process. In this manner, the integrity of the optical mask resolution is maintained at its optimum, and densely integrated circuits can be processed and fabricated.

4 Claims, 6 Drawing Figures

METHOD FOR PHOTOCHEMICALLY ENHANCING RESOLUTION IN PHOTOLITHOGRAPHY PROCESSES

BACKGROUND OF THE INVENTION

In recent times, fabrication of integrated circuits has resulted in extremely dense circuits For example, such densely integrated circuits have feature sizes on the order of 1 micron This density is a direct result of achieving high resolution masks through projection photolithography during the fatrication process.

In prior art projection photolithography, an image, that is, a preselected pattern, is projected onto a layer of photoresist, and the exposed portions of the photoresist layer absorbs the energy of the projected image. The photoresist layer then is chemically developed and processed to form a mask of the projection image, and the mask is used in subsequent etching processes. If the image projected contains extremely small, sharply defined features, the mask produced also defines small features, and the integrated circuits fabricated from the mask can be made correspondingly dense. Unfortunately, two phenomena in the early prior art act to limit the smallness of features and the sharpness of the projection image: standing waves and nonuniform topology of the photoresist layer. The disadvantages of these phenomena have been discussed in detail by Tai et al. in "Submicron optical lithography using an inorganic resist/polymer bilevel scheme," *J. Vac. Sci. Technol.*, 17(5), Sept./Oct. 1980, pp. 1169–1177. These disadvantages are now summarized.

In the early prior art photolithography photoresist layer, light waves are reflected at the surfaces of the layer to interfere with incident waves. The interference between incident and reflected waves causes standing waves within the layer, and the nodes of the standing waves become sites of minimal energy absorption to cause differing light exposure or dose within the layer. As a result, the mask pattern created from the photoresist layer does not sharply correspond to the projection image. The resolution of the image in the mask consequently becomes limited in part by the extent of such standing waves.

In forming a layer of photoresist, the profile, or topography, of the layer is generally not uniform. In other words, the layer normally has, microscopically speaking, undulations of valleys and peaks to result in a layer of varying thickness. Because of the varying thickness, the absorption of energy when an image is projected will also not be uniform, and the image developed in the photolithography mask will correspondingly be not uniformly sharp. The resolution of the mask consequently also becomes limited by the extent of nonuniformity of the photoresist layer topography.

To counter these limiting effects of the early prior art photolithography process, the method represented by FIG. 1 and disclosed by Barlett et al. in "A Two Layer Photoresist Process in a Production Environment," *Proceedings of SPIE*, Vol. 394, 1983, pp. 49–56, is used. In this prior art process, double thickness layers 12 are formed by applying a dye-photoresist layer 22 to an integrated circuit substrate 10 and then superposing a photoresist layer 33 on it. The dye-photoresist layer 22 typically contains a mixture of a dye to absorb reflection waves and in that way eliminate or minimize the standing wave effect. Furthermore, a double thickness layer 12 tends to distribute more uniformly over the integrated circuit substrate 10; this in turn reduces the nonuniform topology effect. In this double thickness layer process, the photoresist layer 33 is exposed and developed to provide a relatively planar mask for patterning the underlying dye-photoresist layer 22. The close proximity of the mask to the dye-photoresist layer in combination with the reflection absorbing dye allows creating a mask of enhanced resolution from the dye-photoresist layer 22 for use in subsequent etching. This process, however, has an inherent disadvantage: control of line width is very difficult because of the high sensitivity of the process to any variations in image exposure dose and photoresist development time and temperature. Consequently, the actual dimensions realized in the process vary considerably from the intended projection dimensions to result in integrated circuits having much less resolution than the projection circuits.

West et al. in "Contrast Enhancement—A Route to Submicron Optical Lithography," *Proceedings of SPIE*, Vol. 394, 1983, pp. 33–38, disclose another refinement in the prior art to overcome the disadvantages in early prior art photolithography for improving the resolution in the photolithographic process. West et al. teach that a photobleachable layer is formed over a photoresist layer. An image is then bleached into the photobleachable layer by irradiating the photobleachable layer with a light of high intensity. As the photobleachable layer is bleached and becomes progressively a transparent optical mask, the irradiating light continues through the transparent optical mask and simultaneously exposes the photoresist layer. In other words, this method creates an optical mask capable of high resolution to be used for exposing a photoresist sublayer. But this prior art scheme requires that the light source remains sufficiently intense in one area to both photobleach the photobleachable layer into an optical mask and expose the photoresist layer with sufficient light to allow the photoresist layer to be developed later but not to further degrade the lightsensitive optical mask. Herein lies its disadvantage: this prior art process, though an improvement over the early prior art, presents a conflicting requirement of irradiating an optical mask and illuminating a photoresist mask with a common light source. This process, then, requires a careful control of light dose in the process so that only a dose sufficient to expose a photoresist layer throught an optical mask is used; otherwise, the optical mask is further degraded and resolution in the integrated circuit fabrication process is lost.

SUMMARY OF THE INVENTION

In the preferred embodiment of the invention, the disadvantage of the prior art of requiring a careful control of the common light source to obtain an optical mask and expose an underlying photoresist layer to light is eliminated. Accordingly, a photobleachable layer is formulated so that when it is irradiated and photobleached to realize the optical mask, the underlying photoresist is essentially unaffected by the irradiation. Likewise, when the photoresist layer is exposed to light using the optical mask obtained, the optical mask in turn is essentially unaffected by the process. In this manner, the optical mask obtained from the photobleachable layer is not degraded by the processing of the photoresist layer.

Specifically, a layer of photoresist is applied to an integrated substrate, for example, an integrated circuit wafer. Next, a layer containing a dye exhibiting a highly nonlinear photobleaching response to incident fluence intensity, for example, a mixture of polymethyl methacrylate (PMMA) and acridine, is applied over the photoresist layer. Because of the high concentration of dye that may be required, the dye is dispersed in the polymer layer. Alternatively, it can be covalently bound to the polymer for forming a relatively uniform mixture. A preselected pattern is then projected onto the layer of nonlinear photobleachable dye, a PMMA/acridine layer in the illustrated embodiment, with a light source having a uniform intensity profile, for example, an excimer laser-illuminated (ELI) projection camera. Because of the dye compound used, a pulse of irradiation of proper intensity is applied such that the whole pulse is absorbed in the photobleaching process; essentially none of the light intensity is allowed to fall and affect the photoresist sublayer. The photobleachable layer is converted into an optical mask, and it is used to mask the photoresist sublayer. A dose of low intensity light of sufficient duration is next used to expose the photoresist layer. Because it is low intensity and because of the judicious choice of a photobleachable dye, the optical mask already formed remains unaffected while the photoresist layer is being exposed. The net result is a substantially undegraded optical mask of high resolution.

Again judiciously choosing the proper dye, dyes of anthracene derivatives in this instance, a photobleachable layer is irradiated without essentially affecting a photoresist sublayer by irradiating it in the proper environment, an environment of oxygen in this instance. Then, when the photoresist sublayer is to be exposed to light after the photobleachable layer has been converted to an optical mask, the environment is changed, for example, to a non-oxygen environment, and the photobleached layer becomes impervious to the light passing through it to irradiate the photoresist sublayer. Again, a substantially undegraded optical mask is preserved to achieve high resolution configurations of integrated circuits.

DETAILED DESCRIPTION OF THE INVENTION

To appreciate the underlying technology in the novel method disclosed, a description of the photobleaching of thin polymer films by excimer laser is first described. Then a description of the application of such photobleaching to photolithography to enhance resolution in accordance with the invention follows.

Figure 5:
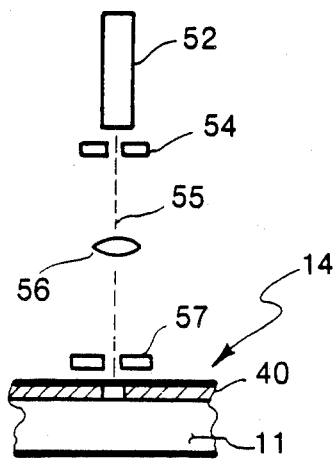
FIG. 5 shows an illustrated embodiment of the invention for obtaining the transmission data of Table I.

In the illustrated embodiment of the invention of FIG. 5, image resolution enhancement in photolithography results from nonlinear responses of strongly intensity-dependent photochemistry in thin polymer films using 249-nm (KrF) laser irradiation at high irradiances. A laser beam 55 from an excimer laser 52 is directed through a metal aperture 54 and is focussed by a lens 56. A second aperture 57, which can be a mask, is centered and placed in the diverging region of the beam 55. This second aperture 57 is used to define the incident fluence for photobleaching a sample 14 containing a thin polymer film 40 which has a highly nonlinear photochemical response to light. The sample 14, a 0.1-mm-thick fused silica disc 11 coated with the film 40, is placed immediately behind this second aperture 57. The aperture 57 and sample 14 can be moved with respect to the lens 56 to vary the incident fluence. At the highest fluence used, the increase in beam diameter between the aperture 57 and the film 40 is less than 10%. Photodiode signals (not shown) for both incident and transmitted energies are recorded on a storage oscilloscope. The absolute values of the fluences are measured and the intensity of the photobleaching pulse is calculated to provide the data in Table I.

TABLE I

| I (MW/sq cm) | No. of Shots | % T |
| --- | --- | --- |
| 4.2 | 2 | 71 |
| 4.0 | 2 | 64 |
| 3.4 | 3 | 59 |
| 3.3 | 3 | 19 |
| 3.2 | 4 | 8.9 |
| 3.0 | 7 | 19 |
| 2.7 | 17 | 5.3 |
| 2.6 | 22 | 0.7 |
| 2.4 | 49 | 0.2 |
| 2.3 | 172 | 0.8 |
| 2.2 | 900 | 0.3 |
| 2.1 | 1400 | 0.3 |
| 2.0 | 1500 | 0.3 |

Number of pulses to obtain measurable transmission for various incident intensities (averaged), and % T of the final pulse. For the 2.3–2.0 MW/sq cm data, the pulses were delivered at 10 Hz; others were spaced by less than 5 sec. For the 4.2–2.7 MW/sq cm data, 2% was the minimum detectable level; after that it was 0.1%.

Figure 6:
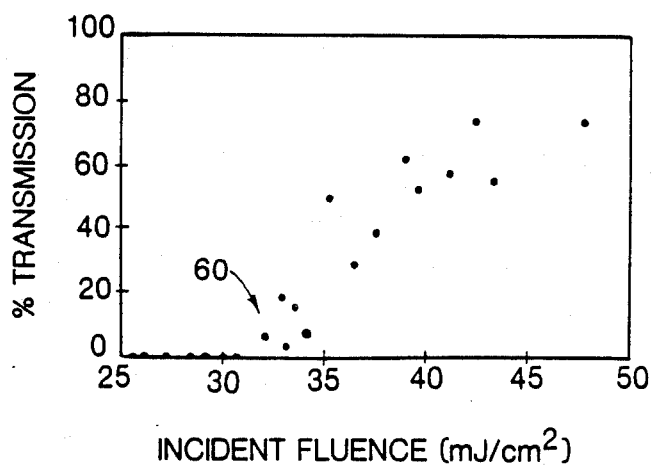
FIG. 6 shows the trend of transmission of the illustrated photobleachable layer with incident fluence.

The sample 14 consists of a layer 40 of approximately 20 wt. % acridine in polymethyl methacrylate (PMMA) spun to a nominal thickness of 1 micron. FIG. 6 shows the transmission T of low-intensity pulses, that is, pulses less than 2 MW/sq cm, versus the fluence of a single prior bleaching pulse, which is totally absorbed for all intensities. That the bleaching is intensity-dependent and not fluence-dependent is demonstrated by the fact that T does not change due to the lower intensity pulses for many hundreds or thousands of pulses; at 2 MW/sq cm it takes about 2200 pulses (at 10 Hz) to get 1% T, and twice that number to get 2%.

Table I shows the dependence of T on integrated dose for various intensities. The shot-to-shot variations in the laser output, which may amount to 15%, make a delivery of a series of pulses of identical intensity impossible. Thus the intensity given is an average, and the strong dependence of bleaching on intensity in the transition region, i.e., the region between about 3 and 4 MW/sq cm, limits the utility of such an average. In particular, the intensity of the first pulse for the 3.4 and 3.3 MW/sq cm data is lower than the average. This fact accounts for the need of two bleaching pulses rather than one as is expected from FIG. 6. Nevertheless, the trend is clear and indicates the remarkable sharpness of the onset of bleaching 60.

Figure 1:
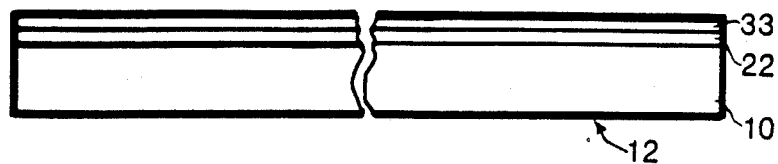
FIG. 1 shows the double layer process in photolithography in the prior art.
Figure 2:
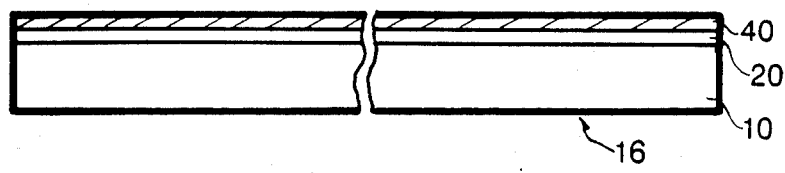
FIG. 2 shows a nonlinear photobleaching layer of PMMA and acridine and a photoresist layer in accordance with an illustrated embodiment of the invention.
Figure 3:
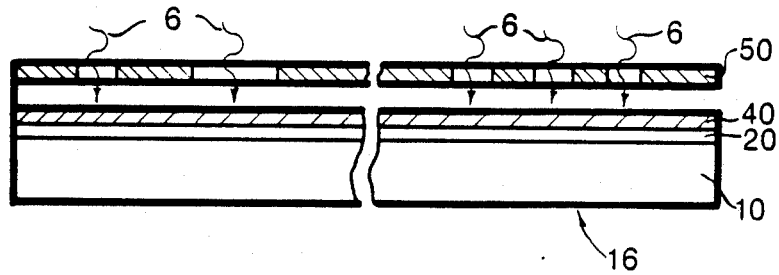
FIG. 3 shows the photobleaching step using laser irradiation.
Figure 4:
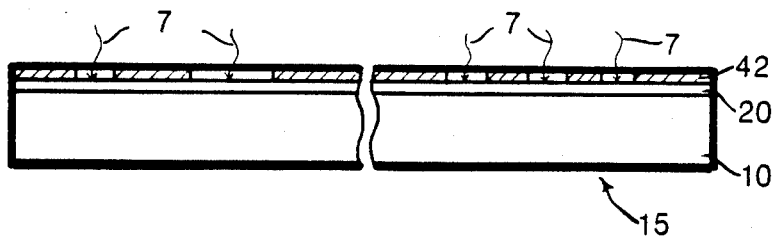
FIG. 4 shows the resultant photobleached layer ready for use as an optical mask for a photoresist sublayer.

Because of the sharp onset of photobleaching in the nonlinear intensity-dependent film 40, the film 40 can be used to create a mask 42 for patterning a photoresist layer 20 in an integrated circuit processing sequence as illustrated in FIGS. 2-4 and yet essentially not affecting the photoresist layer 20 during the process. By photobleaching a projection image 50 onto the film 40 with a high intensity pulse or a series of high intensity pulses calculated to be wholly absorbed by the dye in the photobleaching process, a layer 42 having a highly nonlinear transmission profile corresponding to the image 50 is created essentially without affecting a photoresist sublayer 20 adjacent to it. Light 7 of a lower intensity, an intensity sufficiently low to have essentially no effect on the photobleached film 42, is then passed through the film 42 to the photoresist sublayer 20 in sufficient dose to alter the exposed areas of the sublayer 20. The sublayer 20 is next developed and processed, and the remaining regular integrated circuit etching and processing steps are then carried out. As an example, if a projection image has an overall contrast Imax/Imin of 1.5, and an intensity ratio near the line edge $I(0)/I(-0.0125)$ of 1.08, where $I(-0.0125)$ refers to the intensity 0.0125 micron inside the nominally masked region, and $I(0)$ refers to the line edge, then an $I(0)=3.2$ MW/sq cm will give a low intensity $T(0)=5\%$, approximately. And if $I-(0.0125)=2.96$ MW/sq cm, T will be less than 0.01%. Thus, the film 42, remaining unaltered with the irradiation of the photoresist sublayer 20, is essentially a perfect threshold detector for an image 50 which is very close to the diffraction limit of resolution. In the integrated circuit processing steps, the pattern transfer into the planarizing resist 20 using the photobleached thin film 42 as a mask can occur either in the same alignment step or in a subsequent blanket exposure to avoid any loss in throughput.

An alternate embodiment of the invention alters the photobleaching environment to prevent any degradation or effect of an already formed optical mask when an underlying photoresist layer is irradiated. To accomplish this, an anthracene derivative dye is dispersed in a polymer layer to form a photobleachable layer. This photobleachable layer, which has been formed over an underlying layer of photoresist material, is converted into a high resolution optical mask. An imaging exposure of the photobleachable layer is made by irradiating the layer with a preselected pattern with light in an oxygen environment. Absorption of light in the presence of oxygen results in transformation of the dye to a non-absorbing form in the photobleachable layer. Since the dye in the illustrated embodiment is an anthracene derivative (to which ketocoumarins may or may not be added to sensitize the reaction of the dye), the reaction in the photobleaching process is a self-sensitized photo-oxidation. The excited anthracene, which is in a singlet electronic state, transfers part of its excitation energy to oxygen and converts to a triplet state to produce a singlet oxygen molecule. This singlet oxygen molecule is highly reactive toward the ground-state anthracene; it causes the photobleaching. And with the addition of ketocoumarins, which have a near unity quantum yield of triplets, an overall photo-oxidation yield of nearly unity is achieved. Because of this dependence of the dye on oxidation in the photobleaching process, altering the irradiation process of the underlying photoresist layer to a non-oxygen environment causes the photobleached layer to become impervious to the irradiation dose of the photoresist layer. The integrity of the optical mask remains unchanged, and high resolution integrated circuits are achieved.

I claim:

1. A method of processing integrated ciruits comprising the steps of:
    depositing a first layer of photoresistive material on a substrate;
    depositing a second layer containing a mixture of a polymer and a dye upon said first layer, said dye having a nonlinear photobleaching response to the intensity of an incident fluence;
    irradiating said second layer with a preselected pattern to convert said second layer to an optical mask of said preselected pattern without substantially effecting said first layer; and
    illuminating said second layer to transfer said preselected pattern to said first layer without substantially further effecting said second layer.

2. The method as in claim 1, wherein said dye is acridine.

3. The method as in claim 2, wherein said polymer is polymethyl methacrylate (PMMA).

4. The method as in claim 3, wherein said step of irradiating is irradiating with an excimer laser.

* * * * *